(12) United States Patent
Göötz (10) Patent No.: US 9,831,398 B2
(45) Date of Patent: Nov. 28, 2017

(54) METHOD FOR PRODUCING A CERAMIC CONVERSION ELEMENT AND LIGHT-EMITTING DEVICE

(71) Applicant: OSRAM Opto Semiconductors GmbH, Regensburg (DE)

(72) Inventor: Britta Göötz, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/111,152

(22) PCT Filed: Jan. 20, 2015

(86) PCT No.: PCT/EP2015/050987
§ 371 (c)(1),
(2) Date: Jul. 12, 2016

(87) PCT Pub. No.: WO2015/110419
PCT Pub. Date: Jul. 30, 2015

(65) Prior Publication Data
US 2016/0336491 A1    Nov. 17, 2016

(30) Foreign Application Priority Data
Jan. 23, 2014  (DE) .................. 10 2014 100 771

(51) Int. Cl.
*C03B 29/00*  (2006.01)
*H01L 33/50*  (2010.01)
(Continued)

(52) U.S. Cl.
CPC ............ *H01L 33/504* (2013.01); *B32B 18/00* (2013.01); *C04B 37/005* (2013.01);
(Continued)

(58) Field of Classification Search
CPC combination set(s) only.
See application file for complete search history.

(56) References Cited

U.S. PATENT DOCUMENTS 8,664,678 B2    3/2014  Ooyabu et al.
9,130,131 B2    9/2015  Zhang et al.
(Continued)

FOREIGN PATENT DOCUMENTS

DE    102011010118 A1    8/2012
DE    102012104274    *  11/2013
(Continued)

*Primary Examiner* — Telly Green
(74) *Attorney, Agent, or Firm* — Slater Matsil, LLP (57) ABSTRACT

A method for producing a ceramic conversion element and a light-emitting device are disclosed. In an embodiment the method includes providing at least four functional layers, each being a green body or a ceramic, wherein first functional layer is formed as a first luminous layer comprising an oxide and configured to at least partially convert light of a first wavelength range into light of a second wavelength range, wherein a second functional layer is formed as a second luminous layer comprising a nitride and configured to at least partially convert light of the first wavelength range into light of a third wavelength range, wherein a third functional layer is formed as a first intermediate layer, wherein the first intermediate layer comprises an oxide, wherein a fourth functional layer is formed as a second intermediate layer, and wherein the second intermediate layer comprises a nitride or an oxynitride.

20 Claims, 5 Drawing Sheets

(51) Int. Cl.
- *B32B 18/00* (2006.01)
- *C04B 37/00* (2006.01)
- *C09K 11/77* (2006.01)
- *C09K 11/08* (2006.01)

(52) U.S. Cl.
CPC ...... *C09K 11/0883* (2013.01); *C09K 11/7774* (2013.01); *C09K 11/7792* (2013.01); *C04B 2237/064* (2013.01); *C04B 2237/08* (2013.01); *C04B 2237/343* (2013.01); *C04B 2237/368* (2013.01); *C04B 2237/704* (2013.01); *C04B 2237/72* (2013.01); *H01L 33/501* (2013.01)

(56) References Cited

U.S. PATENT DOCUMENTS

| | | |
|---|---|---|
| 2009/0039375 A1 | 2/2009 | LeToquin et al. |
| 2010/0059771 A1 | 3/2010 | Lowery et al. |
| 2011/0227477 A1 | 9/2011 | Zhang et al. |
| 2013/0320384 A1 | 12/2013 | Liepold et al. |
| 2015/0001499 A1* | 1/2015 | Kim .................. H01L 51/504 257/40 |
| 2015/0188001 A1* | 7/2015 | Schricker ............ H01L 33/0041 257/98 |
| 2015/0270453 A1* | 9/2015 | Eisert .................. H01L 33/502 257/98 |

FOREIGN PATENT DOCUMENTS

| | | |
|---|---|---|
| DE | 102012104274 A1 | 11/2013 |
| JP | 2003078165 A | 3/2003 |
| JP | 2011519162 A | 6/2011 |
| JP | 2012015254 A | 1/2012 |
| JP | 2012502488 A | 1/2012 |
| JP | 2013526007 A | 6/2013 |
| WO | 2008072196 A1 | 6/2008 |
| WO | 2013171151 A2 | 11/2013 |

* cited by examiner

METHOD FOR PRODUCING A CERAMIC CONVERSION ELEMENT AND LIGHT-EMITTING DEVICE

This patent application is a national phase filing under section 371 of PCT/EP2015/050987, filed Jan. 20, 2015, which claims the priority of German patent application 10 2014 100 771.9, filed Jan. 23, 2014, each of which is incorporated herein by reference in its entirety.

TECHNICAL FIELD

A method for producing a ceramic conversion element is provided. A light-emitting device is also provided

SUMMARY OF THE INVENTION

Embodiments provide a method for producing a ceramic conversion element, in which no, or fewer, damaging processes occur during the sintering process. Further embodiments provide a light-emitting device, for which the chromaticity coordinate of the emitted light can be adjusted in a particularly simple and effective manner.

According to at least one embodiment of the method, at least four functional layers are provided. Each of the functional layers can be provided in each case as a green body or as a finished ceramic. One functional layer is thereby formed as a first luminous layer. The first luminous layer comprises an oxide and is configured for at least partially converting light of a first wavelength range into light of a second wavelength range. Another functional layer is formed as a second luminous layer. The second luminous layer comprises a nitride and is also configured for at least partially converting light of the first wavelength range into light of a third wavelength range. Another functional layer is formed as a first intermediate layer and yet another functional layer is formed as a second intermediate layer. The first intermediate layer thereby comprises an oxide and the second intermediate layer comprises a nitride or an oxynitride.

The above-mentioned green bodies can each be, for example, a composite of a plurality of green films laminated one on top of another. Furthermore, in the present case, the term "green body" is also understood to mean a single green film.

In various embodiments, the first wavelength range, the second wavelength range and the third wavelength range are each formed differently from one another. This does not necessarily mean that the first wavelength range, the second wavelength range and the third wavelength range are distinct from one another. Rather, however, the wavelength ranges—although different—can overlap in partial ranges.

The light of the first wavelength range can be, for example, blue light or UV light. For example, the light of the first wavelength range has an intensity maximum at at least 480 nm or ≤460 nm or ≤400 nm. Alternatively or in addition, the light of the first wavelength range can have an intensity maximum at ≥450 nm or ≥420 nm or ≥350 nm.

The light of the second wavelength range can be, for example, greenish or yellowish or green-yellow light. In particular, the light of the second wavelength range can have an intensity maximum at ≤580 nm or ≤540 nm. Alternatively or in addition, the light of the second wavelength range has, for example, an intensity maximum at ≥480 nm or ≥500 nm.

The light of the third wavelength range is then preferably an orange to red light, for example having an intensity maximum at ≤650 nm or ≤680 nm or ≤700 nm. Alternatively or in addition, an intensity maximum of the light of the third wavelength range is, for example, at at least ≥580 nm or ≥595 nm or ≥615 nm.

In particular, the first luminous layer can thus be provided for converting blue light or UV light into yellowish to greenish light. For this purpose, the first luminous layer can comprise or consist of, for example, an yttrium aluminum garnet, YAG for short, and/or a lutetium aluminum garnet, LuAG for short, and/or a lutetium yttrium aluminum garnet, LuYAG for short, and/or a garnet provided with other rare earths. For the purpose of light conversion, the first luminous layer can be doped in particular with an activator, e.g. with a rare earth element such as cerium for example.

In various embodiments, the second luminous layer is provided for converting blue light or UV light or green-yellow light into red to orange light. For example, for this purpose, the first luminous layer comprises or consists of an alkaline earth silicon nitride and/or an alkaline earth aluminum silicon nitride. The alkaline earth metal is, for example, barium or calcium or strontium. In order to convert light, the second luminous layer can be doped with rare earth ions, such as $Eu^{2+}$, as an activator.

The first intermediate layer preferably comprises a similar material to the first luminous layer. The term "similar materials" is understood in this context to mean in particular materials from the same material classes and/or with the same lattice structures and/or with the same components. For example, the first intermediate layer comprises or consists of at least one of the following substances: undoped YAG, undoped LuAG, aluminum oxide, such as $Al_2O_3$ or $Al_xO_y$, yttrium oxide, silicon oxide, titanium oxide, cerium oxide or hafnium oxide.

The second intermediate layer preferably comprises a similar material to the second luminous layer. For example, the second intermediate layer comprises or consists of a silicon oxynitride, such as strontium silicon oxynitride or barium silicon oxynitride, and/or a silicon aluminum oxynitride, such as calcium silicon aluminum oxynitride.

According to at least one embodiment of the method, the at least four functional layers are arranged such that the first intermediate layer lies between the first luminous layer and the second intermediate layer, and the second intermediate layer lies between the first intermediate layer and the second luminous layer.

In various embodiments, after arranging the functional layers, the first luminous layer is in direct contact with the first intermediate layer and not in direct contact with the second intermediate layer and/or the second luminous layer. Preferably, the second luminous layer is also in direct contact with the second intermediate layer but not in direct contact with the first intermediate layer and/or the first luminous layer.

In various other embodiments, the first intermediate layer and the second intermediate layer are also in direct contact with each other. Alternatively, however, further functional layers, such as further luminous layers and/or further intermediate layers, can also be introduced between the first intermediate layer and the second intermediate layer. In a particularly preferred manner, a further luminous layer which converts radiation during normal use is not arranged between the first intermediate layer and the second intermediate layer.

In particular, more than two luminous layers, e.g. three or four luminous layers, can be provided. The luminous layers are then preferably separated from each other in each case by at least two intermediate layers.

According to at least one embodiment of the method, the at least four functional layers are mechanically connected together using a sintering process. After the sintering process, the first and second luminous layers and the first and second intermediate layers are thereby formed as a ceramic.

In at least one embodiment of the method, at least four functional layers are each provided as green bodies or as a ceramic, wherein one functional layer is formed as a first luminous layer comprising an oxide and configured for at least partially converting light of a first wavelength range into light of a second wavelength range. Another functional layer is formed as a second luminous layer comprising a nitride and configured for at least partially converting light of the first wavelength range into light of a third wavelength range. Another functional layer is furthermore formed as a first intermediate layer and yet another functional layer is formed as a second intermediate layer. The first intermediate layer thereby comprises an oxide and the second intermediate layer comprises a nitride or an oxynitride. The functional layers are arranged such that the first intermediate layer lies between the first luminous layer and the second intermediate layer, and the second intermediate layer lies between the first intermediate layer and the second luminous layer. Then, the functional layers are mechanically connected together using at least one sintering process, wherein after the sintering process the first and the second luminous layers and the first and second intermediate layers are formed as a ceramic.

In order to convert blue light into white light, two ceramic luminous layers can be used for example, wherein one ceramic luminous layer converts the blue light into green-yellow light and the second luminous layer converts the blue light into red-orange light. In general, the green-yellow light-emitting luminous layer comprises an oxide and the red-orange light-emitting luminous layer comprises a nitride. If the two luminous layers are directly connected together using a sintering process, reactions or diffusion processes can, however, occur between the two luminous layers, and therefore the luminous properties of the two luminous layers are changed or reduced. In order to prevent such damaging processes during sintering, in the method described herein a first intermediate layer and a second intermediate layer are introduced between the first and second luminous layers. The first intermediate layer comprises a similar material to the first luminous layer and the second intermediate layer comprises a similar material to the second luminous layer. Preferably, the two intermediate layers thus prevent the two luminous layers from being in direct contact with other, and possibly reacting together, during the sintering process. Since, furthermore, the first luminous layer and the first intermediate layer comprise similar materials, in particular reactions do not occur between the first luminous layer and the first intermediate layer during the sintering process, and therefore the first luminous layer is not damaged. The same applies for the second luminous layer and the second intermediate layer.

In various embodiments, the first intermediate layer thus protects the first luminous layer from chemical reactions and/or diffusion processes with the second luminous layer and/or the second intermediate layer during a sintering process. In further embodiments, the second intermediate layer protects the second luminous layer from chemical reactions and/or diffusion processes with the first luminous layer and/or the first intermediate layer during a sintering process. In particular, the first and second intermediate layers are used as buffers or spacers between the first and second luminous layers.

According to at least one embodiment of the method, the concentration of the respective activator in the first and second luminous layers is at least 0.1%, e.g. ≥0.5% or ≥1%. Alternatively or in addition, the concentration can be ≤6% or ≤4% or ≤3%. The activator can be, for example, a rare earth element.

According to at least one embodiment of the method, the first and/or second intermediate layers are transparent to light of the first and/or second wavelength range. In other embodiments, the first intermediate layer and the second intermediate layer are also formed to be non-absorbing for light of the first and second wavelength range. Alternatively or in addition, the first and second intermediate layers are transparent to and/or non-absorbing for light of the third wavelength range.

According to at least one embodiment of the method, the first luminous layer and/or the first intermediate layer and/or the second intermediate layer are formed to be reflective for light of the third wavelength range. Alternatively or in addition, however, the first intermediate layer and/or the second intermediate layer and/or the second luminous layer can also be formed to be reflective for light of the second wavelength range.

For example, the light of the first wavelength range initially impinges upon the first luminous layer where it is partially converted into light of the second wavelength range and then passes, via the first and second intermediate layers, into the second luminous layer where it is partially converted into light of the third wavelength range. Owing to the reflection at one of the functional layers, the light of the third wavelength range can then exit the ceramic conversion element only in a direction away from the first luminous layer. This advantageously increases the efficiency of the ceramic conversion element.

According to at least one embodiment of the method, one or more of the at least four functional layers have scattering centers. At the scattering centers, light of the first and/or second and/or third wavelength range can be diffusely scattered.

Owing to the diffuse scattering at such scattering centers, the direction of light beams in the conversion element can be changed. Light beams which, for example, would remain in the conversion element owing to total reflection can possibly be coupled-out after such a scattering process. This advantageously increases the coupling-out efficiency of the conversion element.

The scattering centers can be introduced, for example, into at least one of the functional layers in the form of scattering particles. The scattering particles can comprise, for example, one of the following materials: aluminum oxide, titanium oxide, yttrium oxide, silicon oxide. In particular, the scattering particles comprise a material which differs from the material of the functional layer into which the nanoparticles are introduced. The scattering particles preferably have a different refractive index from the material of the respective functional layer. The extent of the scattering particles is preferably ≥200 nm, e.g. ≥300 nm. Alternatively or in addition, the extent of the scattering particles is ≤1 μm, e.g. ≤600 nm.

In particular, the scattering centers can also be introduced into at least one of the luminous layers in the form of pores. The concentration and size of the pores can thereby be set by the conditions during the process of sintering the respective functional layer. For example, the pores can have an extent of ≥0.4 μm or ≥1 μm or ≥1.2 μm. Alternatively or in addition, the size of the pores is ≤2 μm, e.g. ≤1.8 μm.

The concentration of scattering centers is, for example, at least 0.4% or 0.6% or 0.8%. Alternatively or in addition, the concentration of scattering centers is at the most 3% or 2% or 1%. The concentration of the scattering centers can relate to the volume proportion or mass proportion of the scattering centers in the functional layers.

According to at least one embodiment of the method, each of the at least four functional layers comprises two plane-parallel major sides in each case. In particular, the at least four functional layers can thus be formed as functional platelets, wherein the extent of the functional platelets can be larger along the major sides than the thickness of the functional platelets perpendicular to the major sides.

The term "major side" is understood here and hereinafter to mean a flat or planar surface. In contrast, the actual surface of a functional layer can certainly comprise surface wrinkling or structuring. The major side is then produced, for example, by placing an equalization plane through the points of the surface of the functional layer.

According to at least one embodiment of the method, the at least four functional layers are arranged one over another in the direction away from a major side of a functional layer. Preferably, the arrangement is effected such that the major sides of the at least four functional layers all extend in parallel with one another. In particular, the four functional layers can thus be arranged as a layer stack. As seen in plan view of the major sides of the functional layers, the at least four functional layers then partially or completely overlap. In particular, the functional layers can also be congruent as seen in plan view of one of the major sides.

The outline of the functional layers is preferably rectangular or round as seen in plan view of the major sides. In particular, however, the functional layers can also comprise recesses which are provided, for example, for the subsequent attachment of bond pad wires. Such a recess can be produced, e.g. at a corner of the functional layers, and therefore the basic shape of the functional platelets deviates from a regular polygon shape.

According to at least one embodiment of the method, the first luminous layer has a thickness of ≥30 μm or ≥50 μm or ≥70 μm. Alternatively or in addition, the first luminous layer has a thickness of ≤200 μm, e.g. ≤150 μm or ≤120 μm. The second luminous layer has, for example, a thickness of ≥5 μm, e.g. ≥10 μm or ≥20 μm. Alternatively or in addition, the second luminous layer has a thickness of ≤100 μm, e.g. ≤80 μm or ≤60 μm. The first and second intermediate layers each have, for example, a thickness of at least 0.2 μm or ≥2 μm or ≥3 μm. Alternatively or in addition, the thickness of the first and/or second intermediate layer(s) is ≤10 μm, e.g. ≤8 μm or ≤6 μm.

According to at least one embodiment of the method, the lateral extent of each of the at least four functional layers along the associated major sides is ≥1 cm or ≥10 cm or ≥15 cm. Alternatively or in addition, the lateral extent of the at least four functional layers is ≤25 cm or ≤20 cm or ≤18 cm. After a separation process, which can occur for example before or after a sintering process, the lateral extent of the functional layers of the finished ceramic conversion element can be ≥5 μm, e.g. ≥50 μm or ≥200 μm. Alternatively or in addition, the extent along each of the major sides is then ≤5 mm, e.g. ≤2 mm or ≤1 mm. The separation process can occur, for example, by sawing or punching or cutting using a laser beam.

According to at least one embodiment of the method, the at least four functional layers are arranged next to each other in a direction in parallel with the major sides, such that the major sides of the at least four functional layers preferably extend in parallel with each other. As seen in plan view of the major sides, the at least four functional layers then in particular do not overlap. The functional layers can thereby be arranged in the same plane but also in different planes. Furthermore, the at least four functional layers then preferably have identical or similar thicknesses.

According to at least one embodiment of the method, the ceramic conversion element is formed in a mechanically self-supporting manner. The ceramic conversion element can thus be applied onto, for example, a light-emitting element after the production process and possibly after the separation process without the ceramic conversion element having to be applied onto the light-emitting element using a method of transferring from a carrier. In this respect, the ratio of thickness of the conversion element to lateral extent of the conversion element is, for example, at least 0.006 or 0.01 or 0.05.

According to at least one embodiment of the method, the first luminous layer is provided as a ceramic or green body. The first intermediate layer is then applied onto the first luminous layer as a green body. Furthermore, the second intermediate layer is applied, as a green body, onto a side of the first intermediate layer facing away from the first luminous layer. Furthermore, the second luminous layer is applied, as a green body, onto a side of the second intermediate layer facing away from the first luminous layer. Then, the at least four functional layers are sintered in a common, single sintering process to form the ceramic conversion element.

For example, the first and/or second intermediate layer(s) and/or the second luminous layer is/are each thereby applied in the form of a slurry, as is typical in a tape-casting process. After the slurry has dried, the next functional layer can then be applied in each case. As a variant, the functional layers can each be provided as a tape.

If all the functional layers are provided as a green body, the composite consisting of the green bodies can advantageously be formed conjointly.

According to at least one embodiment of the method, initially the first luminous layer and the first intermediate layer are sintered together to form a first ceramic composite. In addition, the second luminous layer and the second intermediate layer are sintered together to form a second ceramic composite. Then, the first ceramic composite and the second ceramic composite are sintered together, thus producing the ceramic conversion element. In an advantageous manner, in this procedure, the first luminous layer and also the second luminous layer can be sintered at their respective optimum sintering temperature. The first and second ceramic composites can then be sintered together at lower temperatures.

In the described methods, the first and/or second intermediate layer(s) can also be applied using a deposition process, such as e.g. pulsed laser deposition, PLD for short, or atomic layer deposition, ALD for short, or chemical vapor deposition, CVD for short, or the aerosol deposition method, ADM for short.

A ceramic conversion element is also provided. The ceramic conversion element can be produced using the method described herein. That is to say that all of the features disclosed in conjunction with the production method are also disclosed for the ceramic conversion element, and vice versa.

A light-emitting device is also provided.

According to at least one embodiment, the light-emitting device comprises an electroluminescent body having a radiation exit surface which emits light of a first wavelength range during operation. The electroluminescent body can be, for example a semiconductor layer sequence, in particular an LED. Furthermore, the electroluminescent body can be an organic light-emitting device, OLED for short. The electroluminescent body can emit, for example, light in the blue to green wavelength range, e.g. between 420 nm and 500 nm. Alternatively, the electroluminescent body can also emit light in the UV range, e.g. wavelengths between 300 nm and 400 nm.

According to at least one embodiment, the light-emitting device comprises a ceramic conversion element. The ceramic conversion element is produced, in particular, according to the method described herein. Features of the ceramic conversion element are thus also disclosed for the light-emitting device and vice versa.

The ceramic conversion element can be provided in the beam path of the light of the first wavelength range emitted by the electroluminescent body. For example, the major sides of the first luminous layer and/or the second luminous layer can extend in parallel with the radiation exit surface of the electroluminescent body. As seen in plan view of the major sides, the ceramic conversion element and the radiation exit surface of the electroluminescent body can, for example, overlap, in particular completely overlap.

The light of the first wavelength range emitted by the electroluminescent body can then be at least partially converted into light of the second and third wavelength ranges by the ceramic conversion element. On the whole, the light-emitting device can thus transmit, during operation, mixed light having proportions of the first, second and third wavelength ranges. By using the conversion element, mixed light, e.g. white light having a color rendering value of $R_a \geq 80$ or $R_a \geq 90$ or $\geq 95$, can thus be produced from the light of the first wavelength range, in particular from blue light.

BRIEF DESCRIPTION OF THE DRAWINGS

A method, described herein, for producing a ceramic conversion element and a light-emitting device, described herein, will be explained in more detail hereinafter using exemplified embodiments with reference to drawings. Like reference numerals designate like elements in the individual figures. However, none of the references are illustrated to scale; rather individual elements can be illustrated excessively large for improved understanding.

In the drawing:

FIGS. 1a to 2c show schematic sectional illustrations of exemplified embodiments of the method described herein.

DETAILED DESCRIPTION OF ILLUSTRATIVE EMBODIMENTS

Figure 1A:
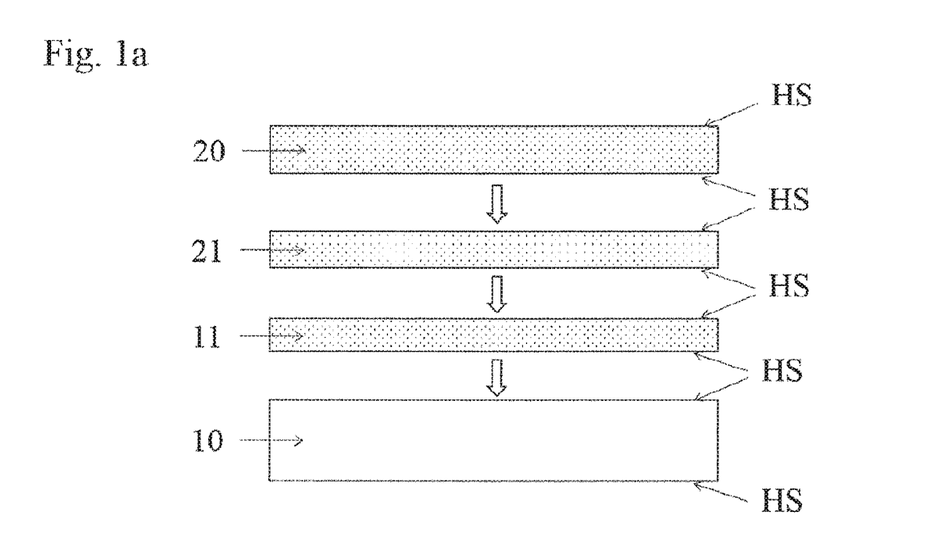

FIG. 1a illustrates a step of a method for producing a ceramic conversion element. Four functional layers are thereby provided, wherein one functional layer is formed as a ceramic first luminous layer 10. A first intermediate layer 11 in the form of a green body is applied onto the ceramic first luminous layer 10. The first intermediate layer 11 can thereby be applied, for example, as a slurry or as a tape. Alternatively, the first intermediate layer 11 can also be applied using a deposition method, such as PLD, ALD, CVD or ADM. After the first intermediate layer 11 has dried, a second intermediate layer 21 is applied, as a green body, onto the side of the first intermediate layer 11 facing away from the first luminous layer 10. The second intermediate layer 21 can be applied using the same method as, or a different method from, that for the first intermediate layer 11. After the second intermediate layer 21 has dried, a second luminous layer 20 is applied, in the form of a green body, onto the side of the second intermediate layer 21 facing away from the first luminous layer 10. The second luminous layer 20 can also be applied in the form of a slurry or as a tape.

In FIG. 1a, each of the four functional layers comprises two plane-parallel major sides HS. The four functional layers are thereby arranged such that the major sides HS extend in parallel with each other and that, as seen in plan view of the major sides HS, the four functional layers overlap, in particular overlap so as to be congruent. Furthermore, the functional layers are arranged such that the first luminous layer 10 is only in direct contact with the first intermediate layer 11 and the second luminous layer 20 is only in direct contact with the second intermediate layer 21. The first and second intermediate layers are also likewise in direct contact with each other.

In the exemplified embodiment according to FIG. 1a, the functional layers have, for example, a lateral extent along the major sides HS of 1 mm. The thickness of the first luminous layer 10 is e.g. 100 µm, the thickness of the second luminous layer 20 is e.g. 80 µm, and the thicknesses of each of the first and second intermediate layers 11, 21 are e.g. 5 µm.

Figure 1B:
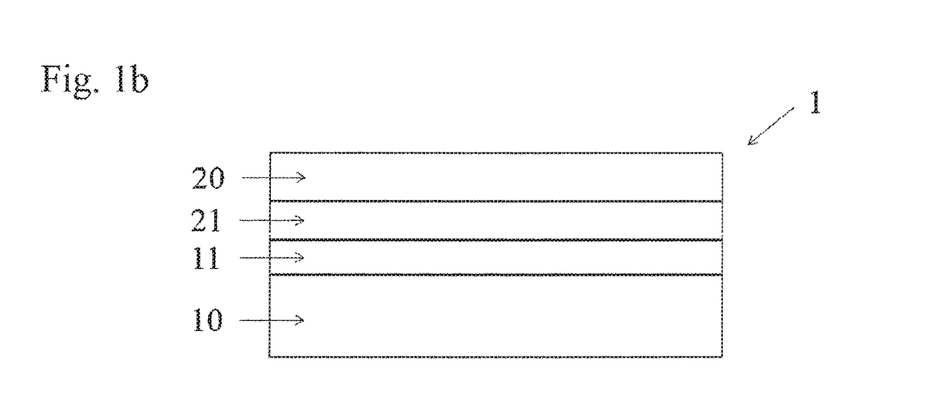

After applying the four functional layers on top of one another, a method step is shown in FIG. 1b in which the four functional layers are mechanically connected together via a sintering process. After the sintering process, the four functional layers are formed as ceramic layers, in particular as a ceramic composite. The composite of the four ceramic functional layers forms the ceramic conversion element 1.

In the sintering process, the first intermediate layer 11 preferably protects the first luminous layer 10 from chemical reactions or diffusion processes with the second intermediate layer 21 and/or with the second luminous layer 20. Moreover, the second intermediate layer 21 protects the second luminous layer 20 from chemical reactions and/or diffusion processes with the first intermediate layer 11 and/or the first luminous layer 10. For example, the first luminous layer 10 comprises a cerium-doped lutetium aluminum garnet, LuAG for short, the first intermediate layer 11 comprises, for example, an undoped YAG, the second intermediate layer 21 comprises, for example, a silicon nitride and the second luminous layer 20 comprises, for example, an $Eu^{2+}$-doped barium strontium silicon nitride. In general, it is advantageous if the first luminous layer 10 and the first intermediate layer 11 comprise identical or similar material classes, in particular similar crystal lattices with similar components. It is likewise advantageous if the second luminous layer 20 and the second intermediate layer 21 comprise identical or similar material classes.

Figure 2A:
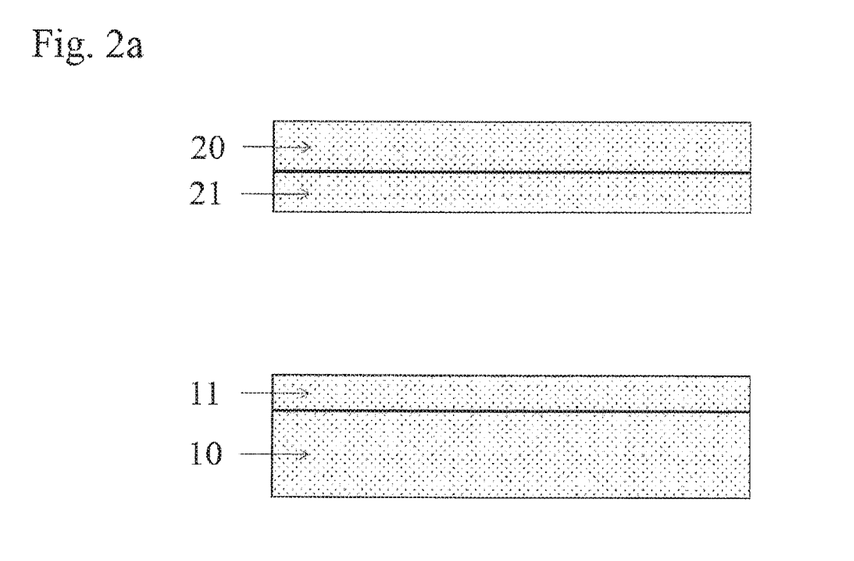

FIG. 2a illustrates a method step of an alternative production method for producing a ceramic conversion element. Initially, the first luminous layer 10 and the first intermediate layer 11 are thereby provided as green bodies. The first luminous layer 10 and the first intermediate layer 11 are placed one on top of another e.g. in the form of tapes and are then laminated. The second luminous layer 20 and the second intermediate layer 21 are likewise placed one on top of another as green bodies, e.g. as tapes.

Figure 2B:
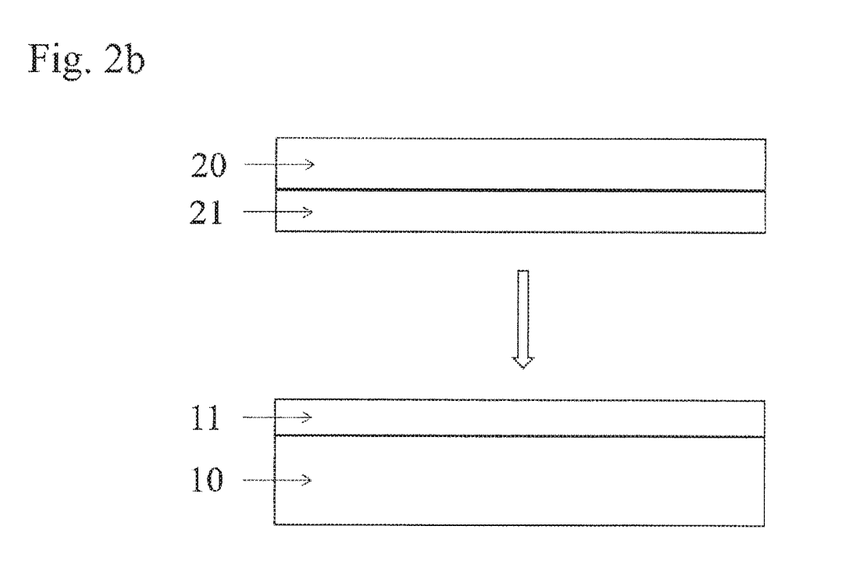

In a subsequent step in the exemplified embodiment according to FIG. 2b, the first luminous layer 10 and the first intermediate layer 11 are sintered to form a first ceramic composite. The second luminous layer 20 and the second intermediate layer 21 are likewise sintered together to form a second ceramic composite. The first and second ceramic composites are then placed one on top of another.

Figure 2C:
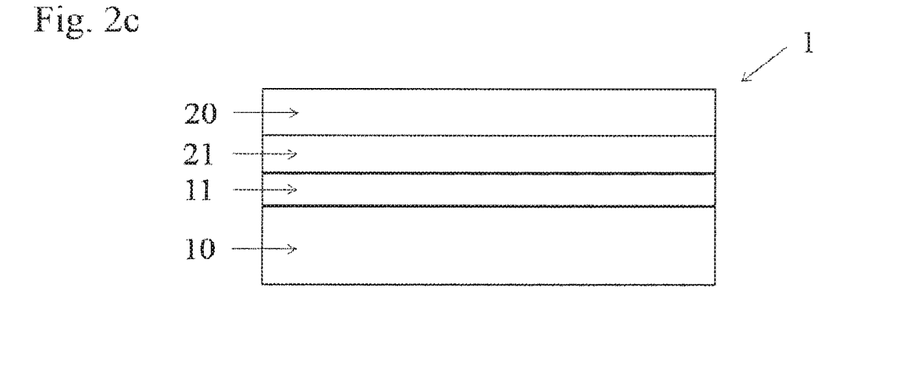

Then, in FIG. 2c, the first ceramic composite and second ceramic composite are mechanically connected together using a further sintering process, thus producing the ceramic conversion element 1. In the exemplified embodiment according to FIG. 2c, like in FIG. 1b, the first luminous layer 10 and the second luminous layer 20 are also separated from one another by the first intermediate layer 11 and the second intermediate layer 21.

The ceramic conversion elements 1 of FIGS. 1b and 2c can be mechanically self-supporting, for example.

In a deviation from the embodiments illustrated in FIGS. 1a to 2c, further intermediate layers and further luminous layers can also be provided for the method, and therefore the ceramic conversion element comprises more than two luminous layers which are each separated from each other by at least two intermediate layers.

Figure 3A:
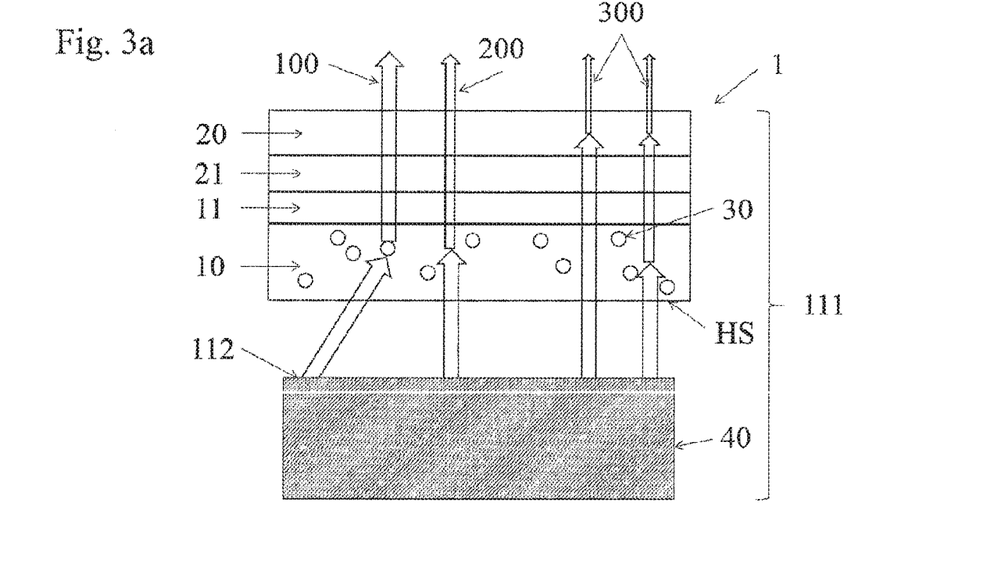
FIGS. 3a to 3c show schematic sectional illustrations of the described light-emitting device.

In the exemplified embodiment in FIG. 3a, a cross-section of a light-emitting device 111 is shown. The light-emitting device 111 comprises an electroluminescent body 40 which emits light of a first wavelength range 100. The light of the first wavelength range 100 is thereby emitted predominantly or exclusively via a radiation exit surface 112 of the electroluminescent body 40. The light of the first wavelength range 100 can be, for example, blue light or UV light.

A ceramic conversion element 1 is arranged in the beam path of the light of the first wavelength range 100 emitted by the electroluminescent body 40. The ceramic conversion element 1 can thereby be in direct contact with the electroluminescent body 40 or be spaced apart from the electroluminescent body 40. For example, the ceramic conversion element 1 can be applied onto the radiation exit surface 112 using a connecting means, such as an adhesive, thus producing a mechanical connection. Alternatively, however, the region between the radiation exit surface 112 and the conversion element 1 can also be at least partially a free space.

The ceramic conversion element 1 in FIG. 3a is designed identically or similarly to the exemplified embodiments according to FIGS. 1b and 2c. In particular, the major sides HS of the ceramic conversion element are arranged in parallel with the radiation exit surface 112 of the electroluminescent body 40. As seen in plan view of the radiation exit surface 112, the ceramic conversion element 1 thereby completely covers the electroluminescent body 40. Further lateral surfaces of the electroluminescent body 40 are not covered by the ceramic conversion element 1.

In the exemplified embodiment according to FIG. 3a, the first luminous layer 10 faces the radiation exit surface 112 of the electroluminescent body 40. Light of the first wavelength range 100 which is emitted via the radiation exit surface 112 thus initially impinges upon the first luminous layer 10. Some of the light of the first wavelength range 100 is converted in the first luminous layer 10 into light of a second wavelength range 200, e.g. into green-yellow light.

Preferably, the first intermediate layer 11 and the second intermediate layer 21 are formed to be transparent to and/or non-absorbing for light of the first wavelength range 100 and light of the second wavelength range 200. The light of the first wavelength range 100 and the light of the second wavelength range 200 can thus pass through the first intermediate layer 11 and the second intermediate layer 21 and thus impinge upon the second luminous layer 20. The second luminous layer 20 thereby converts some of the light of the first wavelength range 100 and possibly some of the light of the second wavelength range 200 into light of a third wavelength range 300, e.g. into red to orange light. For example, however, the first luminous layer 10 can also completely convert the light of the first wavelength range 100 into light of the second wavelength range 200. The second luminous layer 20 can then, for example, completely convert the light of the second wavelength range 200 into light of the third wavelength range 300.

Then, mixed light—consisting of proportions of the light of the first wavelength range 100, of the second wavelength range 200 and of the third wavelength range 300—can exit the light-emitting device 111 via the major side of the second luminous layer 20 facing away from the radiation exit surface 112.

In FIG. 3a, the first luminous layer 10 further comprises scattering centers 30. The scattering centers 30 can be introduced into the luminous layer 10 in the form of pores or in the form of scattering particles. Alternatively or in addition, other functional layers of the ceramic conversion element 1 can also comprise scattering centers 30. The scattering centers 30 ensure that light beams within the ceramic conversion element 1 are diffusively scattered and can thus be coupled out of the ceramic conversion element 1 more efficiently.

In contrast to the exemplified embodiment illustrated in FIG. 3a, where the first luminous layer 10 faces the electroluminescent body 40, the second luminous layer 20 can face the radiation exit surface 112. In this case, it is advantageous if the first intermediate layer 11 and the second intermediate layer 21 are formed to be transparent to and/or non-absorbing for light of the first wavelength range 100 and light of the third wavelength range 300.

Figure 3B:
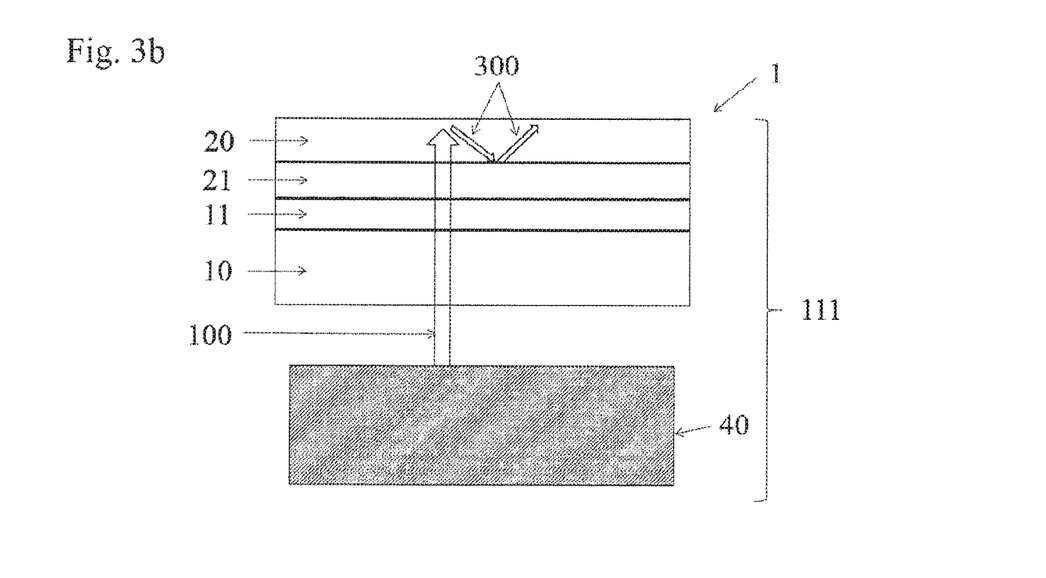

FIG. 3b illustrates a light-emitting device 111 which is formed in a similar manner to the light-emitting device 111 according to FIG. 3a. In FIG. 3b, the second intermediate layer 21 is formed to be reflective for the light of the third wavelength range 300. In an advantageous manner, for example, light of the third wavelength range 300, which was generated in the second luminous layer 20 from light of the first wavelength range 100, can thus exit the ceramic conversion element 1 only in a direction away from the electroluminescent body 40. Such a reflective intermediate layer 21 can thus be used to increase the efficiency of the light-emitting device 111. However, it is not absolutely necessary that the second intermediate layer 21 is formed to be reflective, rather the first intermediate layer 11 and/or the first luminous layer 10 can also be reflective for light of the third wavelength range 300.

Figure 3C:
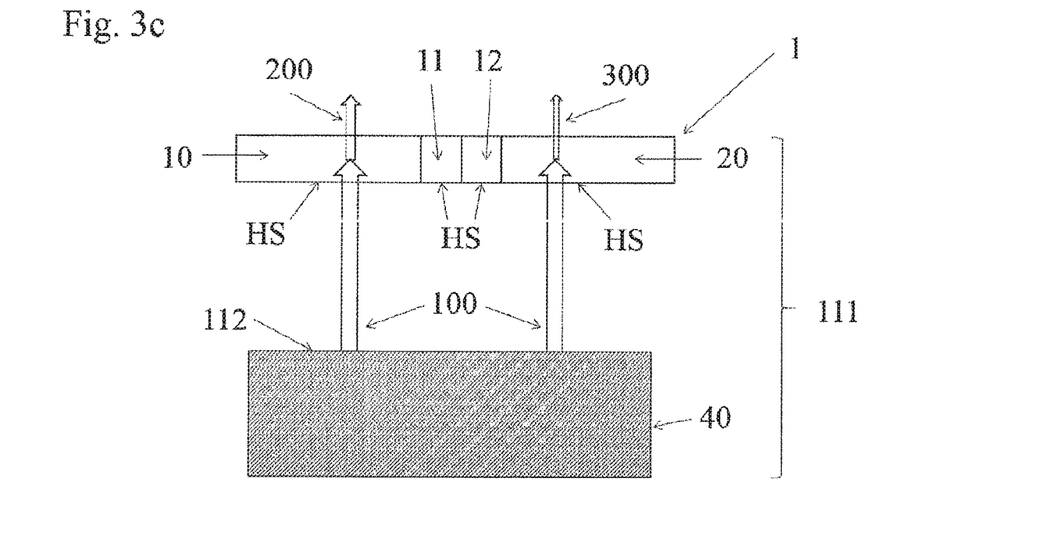

In the exemplified embodiment according to FIG. 3c, a light-emitting device 111 is also provided which is similar to the light-emitting devices 111 according to FIGS. 3a and 3b. In contrast to FIGS. 3a and 3b, the functional layers in FIG. 3c of the ceramic conversion element 1 are arranged next to each other in a direction in parallel with the major sides HS, and therefore the major sides HS extend in parallel with each other. As seen in plan view of the major sides HS, the functional layers do not overlap but rather the functional layers are arranged in a common plane. Light of the first wavelength range 100 which impinges upon the ceramic conversion element 1 via the radiation exit surface 112 thus passes through preferably only one functional layer of the ceramic conversion element 1. In the exemplified embodiment according to FIG. 3c, the thicknesses of all of the functional layers are the same, e.g. 100 μm. The lateral extent of each of the first and second intermediate layers in the direction in parallel with the major sides HS is, for example, 5 µm.

Figure 4:
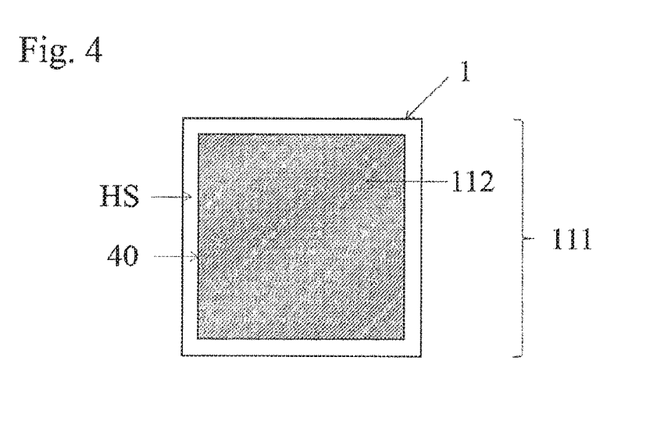
FIG. 4 shows a schematic plan view of a light-emitting device described herein.

FIG. 4 illustrates an exemplified embodiment of an light-emitting device 111, wherein the light-emitting device 111 is viewed in a plan view of the radiation exit surface 112. The electroluminescent body 40 is thereby completely covered by the ceramic conversion element 1. Furthermore, the ceramic conversion element 1 protrudes beyond the electroluminescent body 40 in all directions in parallel with the major sides HS. Such a complete covering of the electroluminescent body 40 advantageously ensures that all of the light of the first wavelength range 100 emitted by the electroluminescent body 40 impinges upon the ceramic conversion element 1 and is thereby partially converted. The conversion element 1 in FIG. 4 can, for example, be formed like the conversion element in FIG. 3a or in FIG. 3b or in FIG. 3c.

As an alternative to the exemplified embodiment illustrated in FIG. 4, the ceramic conversion element 1 can also cover only a part of the radiation exit surface 112 of the electroluminescent body 40. Furthermore, the basic shapes of the radiation exit surface 112 and the functional layers can also be round or polygonal, in addition to the rectangular shapes shown in FIG. 4.

The invention described herein is not limited by the description made with reference to the exemplified embodiments. Rather, the invention encompasses any new feature and any combination of features, including in particular any combination of features in the claims, even if this feature or this combination is not itself explicitly indicated in the claims or exemplified embodiments.

The invention claimed is:

1. A method for producing a ceramic conversion element, the method comprising:
   providing at least four functional layers, each being a green body or a ceramic,
   wherein first functional layer is formed as a first luminous layer comprising an oxide and configured to at least partially convert light of a first wavelength range into light of a second wavelength range,
   wherein a second functional layer is formed as a second luminous layer comprising a nitride and configured to at least partially convert light of the first wavelength range into light of a third wavelength range,
   wherein a third functional layer is formed as a first intermediate layer, wherein the first intermediate layer comprises an oxide,
   wherein a fourth functional layer is formed as a second intermediate layer, and wherein the second intermediate layer comprises a nitride or an oxynitride,
   arranging the first to fourth functional layers such that the first intermediate layer lies between the first luminous layer and the second intermediate layer, and the second intermediate layer lies between the first intermediate layer and the second luminous layer; and
   mechanically connecting the functional layers using at least one sintering process, wherein after the sintering process the first and the second luminous layers and the first and second intermediate layers are formed as a ceramic.

2. The method according to claim 1, wherein the first luminous layer is in direct contact with the first intermediate layer and not in direct contact with the second intermediate layer and the second luminous layer, and wherein the second luminous layer is in direct contact with the second intermediate layer and not in direct contact with the first intermediate layer and the first luminous layer.

3. The method according to claim 2, wherein the first intermediate layer is in direct contact with the second intermediate layer.

4. The method according to claim 1, wherein the first luminous layer comprises a cerium-doped lutetium aluminum garnet, wherein the first intermediate layer comprises an undoped yttrium aluminum garnet, wherein the second intermediate layer comprises a silicon nitride, and wherein the second luminous layer comprises an $Eu^{2+}$-doped alkaline earth silicon nitride.

5. The method according to claim 1, wherein the first and/or second luminous layers comprises at least one activator, and wherein a concentration of the respective activator is between 0.1% and 6% and the respective activator is a rare earth element.

6. The method according to claim 1, wherein the first intermediate layer protects the first luminous layer from chemical reactions and diffusion processes with the second luminous layer and the second intermediate layer during a sintering process, and wherein the second intermediate layer protects the second luminous layer from chemical reactions and diffusion processes with the first luminous layer and the first intermediate layer during a sintering process.

7. The method according to claim 1, wherein the first and second intermediate layers are transparent to and non-absorbing for light of the first and/or second wavelength range.

8. The method according to claim 1, wherein the first luminous layer and/or the first intermediate layer and/or the second intermediate layer are configured to be reflective for light of the third wavelength range.

9. The method according to claim 1, wherein at least one of the first to fourth functional layers comprises scattering centers at which light of the first and/or second and/or third wavelength range is diffusely scatterable.

10. The method according to claim 1, wherein each the first to fourth functional layers comprises two plan-parallel major sides.

11. The method according to claim 1, wherein the first to fourth functional layers are arranged one over another in a direction away from a major side of a functional layer such that the major sides of the first to fourth functional layers all extend in parallel with each other.

12. The method according to claim 1, wherein a thickness of the first luminous layer is between 30 µm and 150 µm, wherein a thickness of the second luminous layer is between 5 µm and 100 µm, and wherein a thicknesses of each of the first and second intermediate layers are between 0.2 µm and 10 µm.

13. The method according to claim 1, wherein, after a separation process, a lateral extent of the first and second luminous layers and the first and second intermediate layers along associated major sides is between 5 µm and 5 mm.

14. The method according to claim 1, wherein the at least first to fourth functional layers are arranged next to each other in a direction in parallel with major sides such that the major sides of the first to fourth functional layers extend in parallel with each other and wherein, as seen in plan view of the major sides, the at least first to fourth functional layers do not overlap.

15. The method according to claim 1, wherein the ceramic conversion element is mechanically self-supporting.

16. The method according to claim 1, wherein the first luminous layer is provided as a ceramic or as a green body, wherein the first intermediate layer is applied on the first luminous layer as a green body, wherein the second intermediate layer is applied, as a green body, on a side of the first intermediate layer facing away from the first luminous layer, wherein the second luminous layer is applied, as a green body, onto a side of the second intermediate layer facing away from the first luminous layer, and wherein the at least first to fourth functional layers are sintered in a common sintering process to form the ceramic conversion element.

17. The method according to claim 1, wherein the first intermediate layer and/or the second intermediate layer is applied using one of the following deposition processes: pulsed laser deposition, atomic layer deposition, chemical vapor deposition or aerosol deposition.

18. The method according to claim 1, wherein the first luminous layer and the first intermediate layer are sintered together to form a first ceramic composite, wherein the second luminous layer and the second intermediate layer are sintered together to form a second ceramic composite, and wherein first ceramic composite and the second ceramic composite are sintered together thereafter.

19. A light-emitting device comprising;
an electroluminescent body having a radiation exit surface which is configured to emit light of a first wavelength range during operation; and
a ceramic conversion element produced according to claim 1, the ceramic conversion element being arranged in a beam path of the light of a first wavelength range, wherein the ceramic conversion element is configured to at least partially convert the light of the first wavelength range emitted by the electroluminescent body into light of a second and a third wavelength ranges such that the light-emitting device is configured to transmit mixed light having proportions of the first, second and third wavelength ranges.

20. A method for producing a ceramic conversion element, the method comprising:

providing at least four functional layers, each being in a green body or a ceramic,
wherein a first functional layer is formed as a first luminous layer comprising an oxide and configured to at least partially convert light of a first wavelength range into light of a second wavelength range,
wherein a second functional layer is formed as a second luminous layer comprising a nitride and configured to at least partially convert light of the first wavelength range into light of a third wavelength range,
wherein a third functional layer is formed as a first intermediate layer and fourth functional layer is formed as a second intermediate layer, wherein the first intermediate layer comprises an oxide, and wherein the second intermediate layer comprises a nitride or an oxynitride,
arranging the functional layers such that the first intermediate layer lies between the first luminous layer and the second intermediate layer, and the second intermediate layer lies between the first intermediate layer and the second luminous layer, wherein the first luminous layer is in direct contact with the first intermediate layer and not in direct contact with the second intermediate layer and the second luminous layer, wherein the second luminous layer is in direct contact with the second intermediate layer and not in direct contact with the first intermediate layer and the first luminous layer, and wherein the first intermediate layer is in direct contact with the second intermediate layer, and
mechanically connecting the functional layers using at least one sintering process, wherein, after the sintering process, the first and the second luminous layers and the first and second intermediate layers are formed as a ceramic.

* * * * *